(12) United States Patent
Chang et al.

(10) Patent No.: US 10,342,157 B2
(45) Date of Patent: *Jul. 2, 2019

(54) FAN CONTROL OF A COMPUTER SYSTEM BASED ON POWER RATIO

(71) Applicant: International Business Machines Corporation, Armonk, NY (US)

(72) Inventors: Shih-Chen Chang, Taipei (TW); Chih-Pao Chang, Taipei (TW); Marcus A. Kelly, Kirkland, WA (US); Yu-Chen Kung, Taipei (TW); Chen-Wei Lee, Taipei (TW); Guo-Sheng Mo, Taipei (TW); Ming-Hui Pan, Taipei (TW); Su-Jen Tsai, Taipei (TW)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 204 days.

This patent is subject to a terminal disclaimer.

(21) Appl. No.: 14/920,355

(22) Filed: Oct. 22, 2015

(65) Prior Publication Data

US 2016/0044830 A1 Feb. 11, 2016

Related U.S. Application Data

(63) Continuation of application No. 14/634,569, filed on Feb. 27, 2015.

(30) Foreign Application Priority Data

Feb. 27, 2014 (TW) .............................. 103106859 A

(51) Int. Cl.
*G06F 1/20* (2006.01)
*H05K 7/20* (2006.01)
(Continued)

(52) U.S. Cl.
CPC ......... *H05K 7/20209* (2013.01); *G05B 15/02* (2013.01); *G05D 23/1917* (2013.01); *G06F 1/20* (2013.01)

(58) Field of Classification Search
CPC . H05K 7/20209; G05D 23/1917; G05B 15/02
(Continued)

(56) References Cited

U.S. PATENT DOCUMENTS 6,188,189 B1 * 2/2001 Blake .................... F04D 27/004
318/268
6,643,128 B2 11/2003 Chu et al.
(Continued)

FOREIGN PATENT DOCUMENTS

TW 200619640 6/2006
TW 201249316 12/2012
(Continued)

OTHER PUBLICATIONS

U.S. Appl. No. 14/634,569, filed Feb. 27, 2015, Office Action dated Aug. 7, 2017.
(Continued)

*Primary Examiner* — Ziaul Karim
(74) *Attorney, Agent, or Firm* — Kunzler, PC; Bruce R. Needham

(57) ABSTRACT

A method for controlling a fan is described and includes controlling a rotation speed of a fan according to a first rotation speed time-variable rate by a controller, and controlling the rotation speed of the fan according to a second rotation speed time-variable rate by the controller in response to a change in an operating parameter of a target device, where the fan and target device are for use in a computer system.

10 Claims, 3 Drawing Sheets

(51) Int. Cl.
*G05B 15/02* (2006.01)
*G05D 23/19* (2006.01)

(58) Field of Classification Search
USPC .................................................. 700/275–287
See application file for complete search history.

(56) References Cited

U.S. PATENT DOCUMENTS

| | | | | |
|---|---|---|---|---|
| 7,425,812 | B2* | 9/2008 | Goldberg | G06F 1/206 |
| | | | | 318/609 |
| 7,756,402 | B2* | 7/2010 | Zou | F04D 27/004 |
| | | | | 318/599 |
| 8,489,250 | B2 | 7/2013 | Aklilu et al. | |
| 9,342,079 | B2 | 5/2016 | David | |
| 2003/0011984 | A1* | 1/2003 | Chu | G06F 1/206 |
| | | | | 361/679.48 |
| 2004/0099747 | A1 | 5/2004 | Johnson | |
| 2004/0264125 | A1* | 12/2004 | Cheng | G06F 1/206 |
| | | | | 361/679.48 |
| 2005/0170770 | A1 | 8/2005 | Johnson | |
| 2007/0076372 | A1 | 4/2007 | Lin | |
| 2007/0124574 | A1* | 5/2007 | Goldberg | G06F 1/206 |
| | | | | 713/100 |
| 2007/0250729 | A1* | 10/2007 | Thomas | G06F 1/203 |
| | | | | 713/322 |
| 2010/0219784 | A1* | 9/2010 | Chang | H02P 29/60 |
| | | | | 318/471 |
| 2010/0228403 | A1* | 9/2010 | Eto | G05D 23/1931 |
| | | | | 700/300 |
| 2012/0116590 | A1 | 5/2012 | Florez-larrahondo | |
| 2013/0073096 | A1* | 3/2013 | Brey | G05B 13/02 |
| | | | | 700/282 |
| 2015/0050121 | A1 | 2/2015 | Wu | |

FOREIGN PATENT DOCUMENTS

| | | |
|---|---|---|
| TW | 201317467 | 5/2013 |
| TW | 201331477 | 8/2013 |

OTHER PUBLICATIONS

U.S. Appl. No. 14/634,569, filed Feb. 27, 2015, Office Action dated Dec. 1, 2017.

* cited by examiner

FAN CONTROL OF A COMPUTER SYSTEM BASED ON POWER RATIO

CROSS-REFERENCE TO RELATED APPLICATIONS

This is a continuation application of and claims priority to U.S. patent application Ser. No. 14/634,569 filed on Feb. 27, 2015 for Paul C B Chang, et al., which claims priority to Taiwan Patent Application No. 103106859 filed on Feb. 27, 2014 for Paul C B Chang, et al., the entire contents of both applications are incorporated herein by reference for all purposes.

FIELD

The present invention relates to a fan control system and method for a computer system, and particularly relates to the control of the fan rotation speed or the control of the time-variable rate of the rotation speed.

BACKGROUND

Generally, a computer system, for example a personal computer or high-end server, will install a cooling fan inside the system for heat dissipation. Particularly, for the existed central processing unit ("CPU") or storage device, such as memory or hard disk, due to the increased processing speed and correspondingly the resulted high temperature, it is further required for employing a cooling fan to enhance the effect of heat dissipation to prevent the system damage due to being overheated.

Most of the prior arts employed the thermal diode, or DTS (Digital thermal Sensor), or PECI (Platform Environment Control Interface) provided by Intel Corp. to monitor the temperature of a device (such as CPU) and further control the cooling fan. When the temperature of the device is higher, it will control the fan to provide more airflow. For example, there are the Q-Fan Technology® provided by ASUSTeK Computer Inc., or Precision Cooling Technology®, and QST (Quiet System Technology®) provided by Intel Corp., in which PECI employs the on-die DTS to provide the digital information regarding to the temperature of a processor, and QST uses the PECI reading outputted by CPU as feedback to control the fan to make the temperature from a sensor approaching a Tcontrol value.

Also the U.S. Pat. No. 7,425,812 disclosed some known methods of fan control, particularly for the control of the time-variable rate of the rotation speed.

BRIEF SUMMARY

According to an embodiment of the present invention, a fan control system for use in a computer system is provided. The computer system comprises a fan and a target device. The fan control system comprises a controller for controlling the rotation speed of the fan. The controller further determines the time-variable rate of the fan rotation speed according to an operating parameter of the target device.

A method for controlling a fan is described and includes controlling a rotation speed of a fan according to a first rotation speed time-variable rate by a controller, and controlling the rotation speed of the fan according to a second rotation speed time-variable rate by the controller in response to a change in an operating parameter of a target device, where the fan and target device are for use in a computer system.

An apparatus for controlling a fan in a computer system is disclosed. The apparatus includes a fan, a target device cooled by the fan, and a controller. The controller determines if a present value of an operating parameter of the target device is above a reference value, sets a fan acceleration rate and a fan deceleration rate, where the acceleration rate is higher than the deceleration rate, in response to determining that the value of the operating parameter is greater than or equal to the reference value, and sets a fan acceleration rate and a fan deceleration rate, where the acceleration rate is lower than the deceleration rate, in response to determining that the value of the operating parameter is lower than the reference value.

The features, advantages and similar expressions disclosed in this specification do not mean that all the features and advantages realized by the present invention should be within any single embodiment of the present invention. It should be noted that the expressions regarding to the features and advantages indicate those specific features, advantages or characteristics described in connection with embodiments are included in at least one embodiment of the present invention. Therefore, the descriptions regarding to the features, advantages and similar expressions in the specification are related to the similar embodiments, but not necessarily.

These features and advantages can be further understood by referring to the description below and attached claims or using the Detailed Description of the present invention described below.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION OF THE INVENTION

Figure 1:
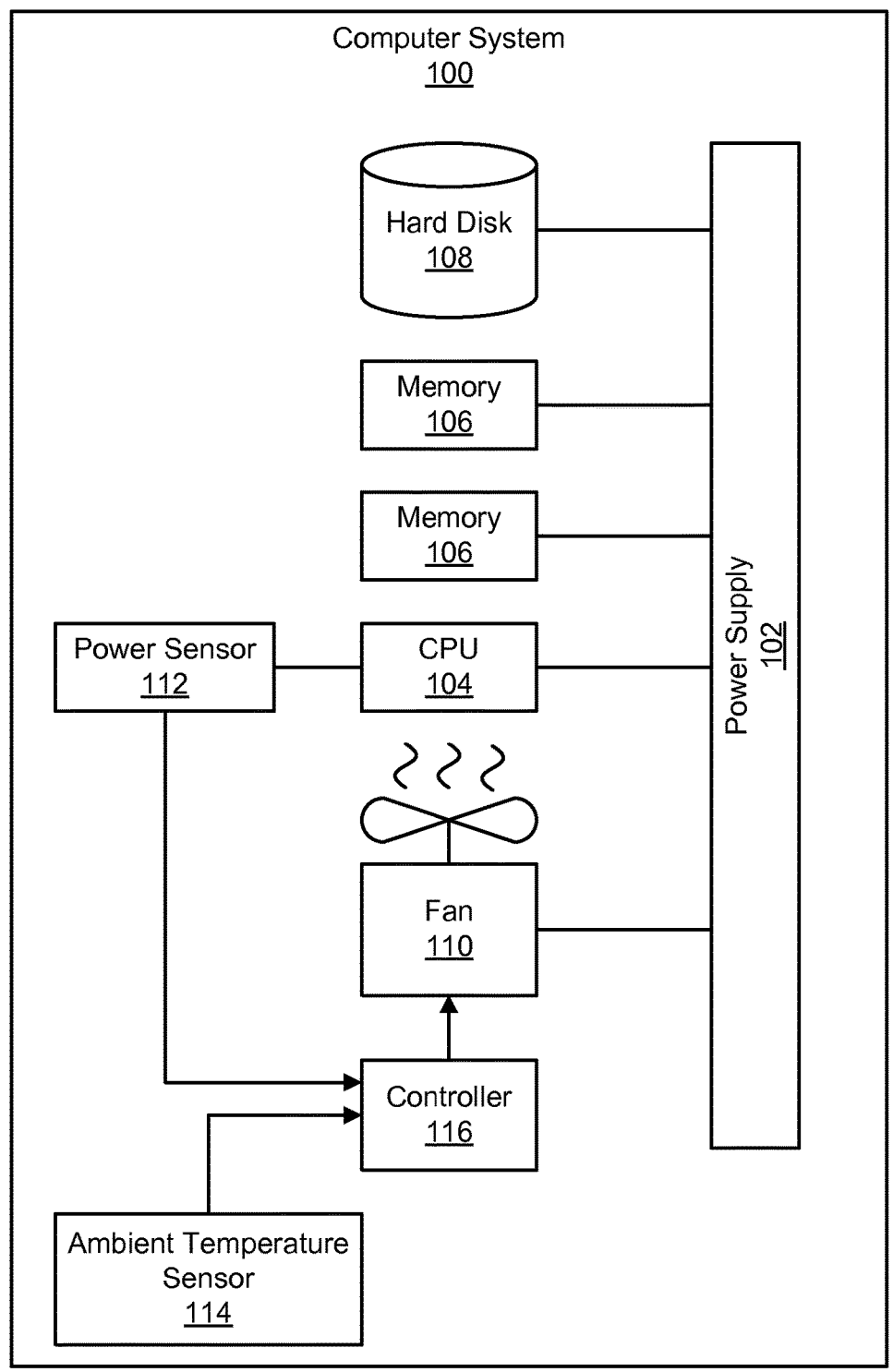
FIG. 1 shows a computer system according an embodiment of the present invention.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

The present invention may be a system or a method, and may include a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network.

Computer readable program instructions for carrying out operations of the present invention may be assembler instructions, instruction-set-architecture ("ISA") instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer. In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Furthermore, the described features, structures, or characteristics of the embodiments may be combined in any suitable manner. In the following description, numerous specific details are provided, such as examples of programming, software modules, user selections, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

The description of elements in each figure may refer to elements of proceeding figures. Like numbers refer to like elements in all figures, including alternate embodiments of like elements.

In one aspect, the present invention puts forth a novel fan control system and method and a computer system with a fan control system. The present invention emphasizes particularly the control of the time-variable rate (also known as the rotation speed slope) of a fan rotation speed, and thus the present invention concerns the time taken by a fan to change from a rotation speed to the next rotation speed, for example, the time spent on increasing from 3000 rpm to 4000 rpm. According to the prior art, when designing fan control, fan manufacturers seldom give considerations to the time-variable rate of fan rotation speed but just treat fan noise reduction as a factor in determining the time-variable rate of fan rotation speed (as disclosed in U.S. Pat. No. 7,425,812).

The present invention further emphasizes that poor control of the time-variable rate of fan rotation speed, for example, excessive acceleration or excessive deceleration, causes disadvantages to fans, that is, the fans are energy-inefficient and predisposed to noise that irritate users. In view of this, the present invention gives considerations to the operating conditions (such as temperature, a consumed power, the difference between the consumed power and a rated power, the ratio of the consumed power to the rated power) of a target device and thus determines a proper time-variable rate of fan rotation speed with a view to circumventing the aforesaid drawbacks of the prior art.

According to another embodiment of the present invention, a fan control method for use with the aforesaid fan control system is provided. The method comprises the steps of:
controlling a rotation speed of a fan according to a first rotation speed time-variable rate by a controller; and
controlling the rotation speed of the fan according to a second rotation speed time-variable rate by the controller in response to a change in an operating parameter of a target device.

In another aspect, the present invention puts forth an operating parameter of a novel target device, that is, the ratio of the consumed power to the rated power, for reference in setting fan rotation speed. According to an embodiment of the present invention, a fan control system for use in a computer system is provided. The computer system comprises a fan and a target device. The fan control system comprises a controller. The controller determines the rotation speed of the fan according to the ratio of the consumed power of the target device to its rated power.

A fan control system for use in a computer system is described. The computer system includes a fan and a target device. The fan control system includes a controller for controlling a rotation speed of the fan, where the controller further determines a time-variable rate of the fan rotation speed according to a value of an operating parameter of the target device.

In one embodiment, the controller determines the time-variable rate of the fan rotation speed according to a consumed power of the target device. In another embodiment, the controller determines the time-variable rate of the fan rotation speed according to a ratio of the consumed power of the target device to the rated power of the target device. In another embodiment, the target device is a central processing unit ("CPU"), a memory, or a hard disk drive. In another embodiment, the fan cools the target device. In another embodiment, the controller determines a rotation speed of the fan according to the value of the operating parameter. In yet another embodiment, the value of the operating parameter includes an ambient temperature.

A method for controlling a fan is described in various embodiments. The method includes controlling a rotation speed of a fan according to a first rotation speed time-variable rate by a controller, and controlling the rotation speed of the fan according to a second rotation speed time-variable rate by the controller in response to a change in an operating parameter of a target device, where the fan and target device are for use in a computer system.

In one embodiment, the first rotation speed time-variable rate is a first acceleration of the rotation speed of the fan, and the second rotation speed time-variable rate is a second acceleration of the rotation speed of the fan. In another embodiment, the operating parameter is a consumed power of the target device, and the second acceleration is larger than the first acceleration in response to an increase in the consumed power of the target device. In another embodiment, the first rotation speed time-variable rate is a first deceleration of the rotation speed of the fan, and the second rotation speed time-variable rate is a second deceleration of the rotation speed of the fan. In a further embodiment, the operating parameter is a consumed power of the target device, and the second deceleration is less than the first deceleration in response to an increase in the consumed power of the target device.

In one embodiment, response to the change in the operating parameter also includes response to a change in the ratio of the consumed power of the target device to its rated power. In a further embodiment, response to a change in the ratio of the consumed power of the target device to its rated power further comprises response to that the ratio of the consumed power of the target device to its rated power is larger or smaller than a reference value. In another embodiment, the target device includes a central processing unit ("CPU"), a memory, or a hard disk drive.

An apparatus for controlling a fan in a computer system is also described. The apparatus includes a fan, a target device cooled by the fan, and a controller. The controller determines if a present value of an operating parameter of the target device is above a reference value, sets a fan acceleration rate and a fan deceleration rate, where the acceleration rate is higher than the deceleration rate, in response to determining that the value of the operating parameter is greater than or equal to the reference value, and sets a fan acceleration rate and a fan deceleration rate, where the acceleration rate is lower than the deceleration rate, in response to determining that the value of the operating parameter is lower than the reference value.

In one embodiment the controller drives a rotation speed of the fan to a first rotation speed in response to determining that the value of the operating parameter is greater than or equal to the reference value, and drives the rotation speed of the fan to a second speed rotation speed in response to determining that the value of the operating parameter is less than the reference value, where the first rotation speed is greater than the second rotation speed. In another embodiment, the controller determines a consumed power of the target device, and determines a ratio of the consumed power of the target device to a rated power of the target device, where the value of the operating parameter of the target device includes the ratio of the consumed power of the target device to the rated power of the target device. In another embodiment, the target device includes a central processing unit (CPU), a memory, or a hard disk drive. In another embodiment, the value of the operating parameter includes an ambient temperature.

FIG. 1 shows hardware architecture of a computer system 100 in an embodiment, which comprises a power supply 102, a CPU 104, a memory 106, a hard disk 108, a fan 110, a power sensor 112, an ambient temperature sensor 114, and a controller 116. Other basic architectures and components for computer system 100 may be referred to an ordinary personal computer or server, such as System X®, Blade Center® or EServer® server from IBM Corp, or referred to the aforementioned U.S. Pat. No. 7,425,812. The details not related to the present invention will be omitted without description.

When a computer system 100 is operating, the power supply 102 is mainly providing DC power to a CPU 104, a memory 106, a hard disk 108, and a fan 110. It should be noted that the memory 106, the hard disk 108 and the CPU 104 could be called target devices in the specification, because they will generate a large amount of heat during operating. The purpose of the fan 110 is to cool down these target devices. In an embodiment shown in FIG. 1, only the CPU 104 has a fan 110. But, in other embodiments not shown, the CPU 104, the memory 106 and the hard disk 108 may have their individual corresponding fan to enhance the efficiency of heat dissipation. In order to clearly describe the present invention, only the CPU 104 and a single fan 110 are used in the description. However, the skilled in the art may replace the CPU 104 with the memory 106, the hard disk 108, or any other target device, which may generate heat and need to be cooled in the computer system.

Preferably, the fan 110 is a so-called "smart fan", which has a microprocessor 102 (not shown) to drive or manage the operation of the fan 110. For example, the microprocessor of the fan 110 can receive Pulse Width Modulation (PWM) signals and control the speed of the fan 110 according to the duty cycle in PWM signals.

The power detector 112 cannot only measure the voltage difference V on both ends of CPU 104, but also provide a tiny resistance, such as 0.001 Ohm, for measuring the current I of CPU 104. And, the controller 116 may employ the measured voltage drop V and the current I to obtain the power consumed by CPU 104. The skilled in the art may replace the CPU 104 with the memory 106, the hard disk 108 or any other target device in the computer system which will generate heat and need to be cooled, and measure the power actually consumed by these device for usage. In other embodiments, the power detector 112 may be omitted, and the target device (for example, the one having a CPU 104 with a built-in power sensor) may provide the information of the power being consumed.

The ambient temperature sensor 114 is configured for detecting the temperature Te in the operating environment, i.e. room temperature, which is preferably installed outside the computer system 100. The ambient temperature sensor 114 may employ a conventional digital thermal sensor, and directly generate a digital signal corresponding to the detected ambient temperature. It should be noted that the ambient temperature sensor 114 and the CPU 104 should have appropriate distance therebetween to prevent the influence of heat generated by CPU 104 from the ambient temperature sensor 114.

The controller 116 comprises a microprocessor and memory (not shown), preferably integrated in BMC (Baseboard Management Controller) on a motherboard (not shown) of the computer system 100, such as VSC 452 BMC provided by Maxim Corp. or SE-SM4210-P01 BMC provided by ServerEngines Corp. It should be noted that the controller 116 may also be implemented as an independent controller.

The controller 116 can have one or more signal ports for outputting control signals to the fan 110 so as to control the operation of the fan 110 or to set the configuration of the fan 110. For example, the controller 116 can output PWM signals with different duty cycles to the microprocessor of the fan 110 as the rotating speed control signal to control the rotating speed of the fan 110.

In another aspect, particularly, controller 116 effectuates the setting of different time-variable rates of fan rotation speed by means of firmware. For example, controller 116 provides two time-variable rates, namely X rpm/s or 6X rpm/s (i.e., 6 times of X rpm/s), for acceleration, and provides two time-variable rates, namely Y rpm/s or 4Y rpm/s (i.e., 4 times of Y rpm/s), for deceleration. Related details are described hereunder.

In this embodiment, controller 116 further comprises an A/D port (not shown) for receiving voltage drop and current detected by power sensor 112 and calculating the power consumed by CPU 104 (memory 106, or hard disk 108) according to the received voltage drop and current.

Selectively, in an embodiment where CPU 104 is built-in with a power sensor, controller 116 directly accesses power information provided by CPU 104.

Moreover, in a preferred embodiment, controller 116 not only calculates the difference between the power consumed by CPU 104 and its rated power but also calculates the ratio of the power consumed by CPU 104 to its rated power. In an alternative embodiment, controller 116 directly outputs a proper pulse width modulation (PWM) signal of a duty cycle to a microprocessor of fan 110 according to CPU 104 the ratio of the consumed power to its rated power, such that the PWM signal functions as a rotation speed control signal for controlling the rotation speed of fan 110. In general, the larger the ratio is, the more likely the CPU 104 is fully loaded, and the more is the heat generated by the CPU 104; hence, rotation speed must be augmented.

Moreover, controller 116 further comprises another A/D port (not shown) for receiving an ambient temperature detected by an ambient temperature sensor 114 or an operating parameter information (for example, an operating parameter pertaining to CPU and related to the reading of PECI (Platform Environment Control Interface) or an operating parameter pertaining to memory and related to the reading of TSOD (Thermal Sensor on DIMM) about a target device.

Figure 2:
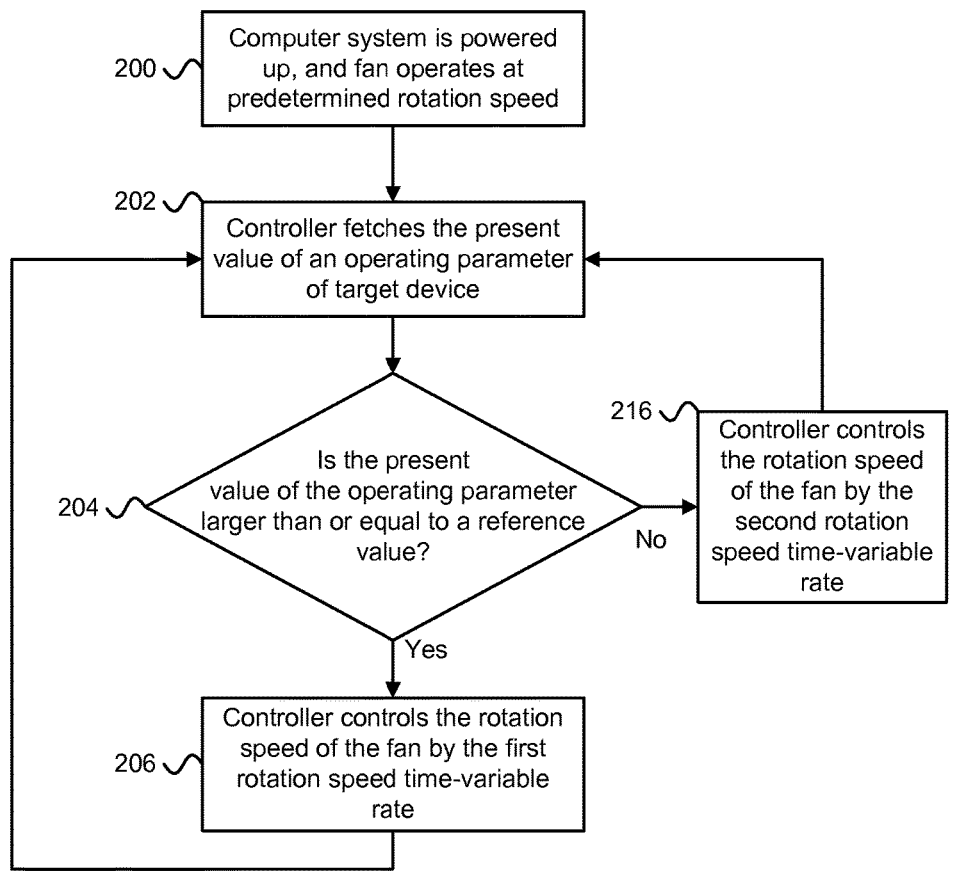
FIG. 2 shows a method flow chart according to an embodiment of the present invention.

A fan setting and controlling method according to an embodiment of the present invention is hereunder illustrated with hardware architecture depicted in FIG. 1 and the flow chart of FIG. 2.

Fan Control Process Flow

Step 200: computer system 100 is powered up, and controller 116 drives fan 110 at a predetermined initial rotation speed (such as 3000 rpm).

Step 202: controller 116 fetches the present value of an operating parameter of a target device (such as CPU 104). In a preferred embodiment, the operating parameter of CPU 104 is the ratio of the present consumed power to the rated power of CPU 104, which is, however, not restrictive of the present invention. It is also feasible that the operating parameter of CPU 104 is its present consumed power or the difference between the present consumed power and the rated power. In another embodiment, the operating parameter is an ambient temperature or the temperature (obtained via PECI) of CPU 104.

Step 204: controller 116 determines whether the present value of the operating parameter is larger than or equal to a reference value. The fan setting and controlling method of the present invention is hereunder exemplified by an embodiment where the operating parameter is the ratio of the present consumed power of CPU 104 to its rated power. In this embodiment, the reference value is set to 0.7 and stored in the firmware of controller 116. However, understandably, the reference value is adjustable as needed, and the user can adjust the reference value through a proper interface as needed. In this step, if the determination is affirmative, the process flow of the method will go to Step 206, otherwise the process flow of the method will go to Step 216.

Step 206: when the ratio of the consumed power to the rated power is larger than or equal to the reference value 0.7, the target device is deemed busy and thus likely to generate much heat, whereas the heat load of the target device comes close to its allowable safety limit. In this situation, if controller 116 determines that fan rotation speed is to be increased, the acceleration must be great, so as to avoid a problem described as follows: the speed at which the heat dissipation capability of the fan increases is lower than the speed at which the heat generated from the target device increases, and thus the heat load of the target device accumulates continuously to eventually go beyond its allowable safety limit. Alternatively, if controller 116 determines that fan rotation speed is to be decreased, the deceleration must be small, so as to avoid a problem described as follows: the speed at which the heat dissipation capability of the fan decreases is higher than the speed at which the heat generated from the target device decreases, and thus the heat load of the target device accumulates continuously to eventually go beyond its allowable safety limit. Hence, regarding the embodiment in which there are two time-variable rates, i.e., X rpm/s or 6X rpm/s, to choose from for acceleration and two time-variable rates, i.e., Y rpm/s or 4Y rpm/s, to choose from for deceleration, Step 206 is intended to allow controller 116 to choose the larger time-variable rate 6X rpm/s for acceleration and choose the smaller time-variable rate Y rpm/s for deceleration. Step 206 can be followed by Step 202.

Step 216: when the ratio of the consumed power of target device to its rated power is less than the reference value 0.7, the target device is deemed less busy and less likely to generate little heat, thereby, in particular, giving the heat load of the target device plenty of leeway to stay below its allowable safety limit. In this situation, even if controller 116 determines that fan rotation speed must increase, the acceleration can be mild, so as to save energy and reduce noise. Alternatively, if controller 116 determines that fan rotation speed is to be further decreased, the deceleration must be great, so as to save energy and reduce noise. Hence, regarding the embodiment in which there are two time-variable rates, i.e., X rpm/s or 6X rpm/s, to choose from for acceleration and two time-variable rates, i.e., Y rpm/s or 4Y rpm/s, to choose from for deceleration, Step 216 is intended to allow controller 116 to choose the smaller time-variable rate X rpm/s for acceleration and choose the larger time-variable rate 4Y rpm/s for deceleration. Step 216 can be followed by Step 202.

The way in which controller 116 determines the time-variable rate of fan rotation speed is described above. For details of simple rotation speed control, that is, determining the target of rotation speed adjustment, refer to the prior art, such as U.S. Pat. No. 8,489,250 issued to the applicant of this patent application and is hereinafter incorporated by reference. The fan setting and controlling method according to another embodiment of the present invention is hereunder illustrated with hardware architecture depicted in FIG. 1 and the flow chart of FIG. 3.

Step 300: computer system 100 is powered up, and controller 116 drives fan 110 at a predetermined initial rotation speed (such as 3000 rpm).

Step 302: controller 116 fetches the ratio of the present consumed power of a target device (such as CPU 104) to its rated power.

Step 304: controller 116 determines whether the ratio is larger than or equal to a reference value. In this embodiment, the reference value is set to 0.7 and stored in the firmware of controller 116. However, understandably, the reference value is adjustable as needed, and the user can adjust the reference value through a proper interface. In this step, if the determination is affirmative, the process flow of the method will go to Step 306, otherwise the process flow of the method will go to Step 316.

Step 306: when the ratio of the consumed power to the rated power is larger than or equal to the reference value 0.7, the target device is deemed busy and likely to generate much heat, and thus controller 116 determines that the fan rotation speed must increase from 3000 rpm to a higher rotation speed, say, 4000 rpm. Alternatively, when the ratio of the consumed power to the rated power is larger than or equal to another reference value 0.8, controller 116 determines that fan rotation speed must increase from 3000 rpm to a higher rotation speed, say, 5000 rpm. Step 306 can be followed by Step 302.

Step 316: when the ratio of the consumed power to the rated power is less than the reference value 0.7, target device is deemed less busy and likely to generate little heat, and in consequence controller 116 determines that the fan rotation speed can be kept at the initial rotation speed, that is, 3000 rpm, or determines to reduce the fan rotation speed from the high rotation speed to 3000 rpm. Step 316 can be followed by Step 302.

Figure 3:
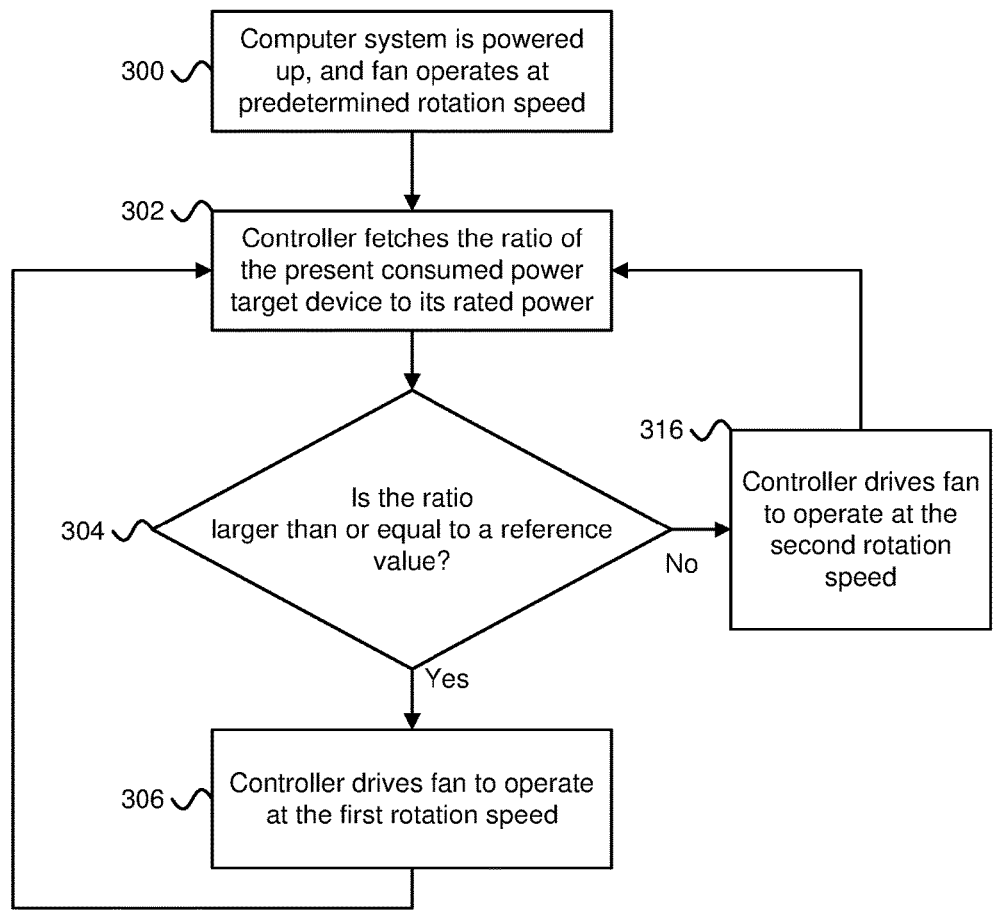
FIG. 3 shows a method flow chart according to another embodiment of the present invention.

Understandably, the methods in the embodiments illustrated with FIG. 2 and FIG. 3 can be implemented together; hence, both the target of adjustment of the rotation speed and the time-variable rate for adjustment of the rotation speed can be determined according to the ratio of the consumed power of the target device to its rated power.

The foregoing preferred embodiments are provided to illustrate and disclose the technical features of the present invention, and are not intended to be restrictive of the scope of the present invention. Hence, all equivalent variations or modifications made to the foregoing embodiments without departing from the spirit embodied in the disclosure of the present invention should fall within the scope of the present invention as set forth in the appended claims.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for controlling a fan, the method comprising:
controlling a rotation speed and acceleration and deceleration of a fan according to a first rotation speed time-variable rate by a controller, wherein the first rotation speed time-variable rate is a first acceleration rate or a first deceleration rate of the fan, wherein a rotation speed time-variable rate comprises a time for a rotation speed of the fan to change from a first speed to a second speed;
determining a change in a value of an operating parameter of a target device, wherein the operating parameter is a consumed power of the target device;
determining a time-variable rate of the fan rotation speed according to the change in the value of the operating parameter, wherein determining the time-variable rate of the fan rotation speed comprises determining the time-variable rate of the fan rotation speed according to a ratio of the consumed power of the target device to the rated power of the target device;

setting, by the controller, a second rotation speed time-variable rate of the fan rotation speed in response to the change in the value of the operating parameter of the target device, wherein the second rotation speed time-variable rate is based on the determined time-variable rate of the rotation speed of the fan and is a second acceleration rate or a second deceleration rate of the rotation speed of the fan; and controlling the rotation speed and acceleration or deceleration of the fan according to the second rotation speed time-variable rate by the controller in response to setting the second rotation speed time-variable rate of the fan rotation speed, wherein the fan and target device are for use in a computer system.

2. The method of claim 1, wherein the second acceleration rate is larger than the first acceleration rate in response to an increase in the consumed power of the target device.

3. The method of claim 1, wherein the second deceleration rate is less than the first deceleration rate in response to an increase in the consumed power of the target device.

4. The method of claim 1, wherein response to the change in the operating parameter further comprises response to a change in a ratio of the consumed power of the target device to a rated power of the target device.

5. The method of claim 4, wherein a response to a change in the ratio of the consumed power of the target device to the rated power of the target device further comprises a response to that the ratio of the consumed power of the target device to the rated power of the target device is larger or smaller than a reference value.

6. The method of claim 1, wherein the target device comprises one of a central processing unit ("CPU"), a memory, and a hard disk drive.

7. The method of claim 1, wherein the fan cools the target device.

8. The method of claim 1, further comprising determining a rotation speed of the fan according to the value of the operating parameter.

9. The method of claim 1, further comprising:

driving a rotation speed of the fan to a first rotation speed in response to determining that the value of the operating parameter is greater than or equal to a reference value; and driving the rotation speed of the fan to a second speed rotation speed in response to determining that the value of the operating parameter is less than the reference value, wherein the first rotation speed is greater than the second rotation speed.

10. The method of claim 1, wherein the controller sets an acceleration rate of the fan higher than a deceleration rate of the fan in response to the ratio of the consumed power to rated power of the target device being greater than a reference value and wherein the controller sets an acceleration rate of the fan lower than a deceleration rate of the fan in response to the ratio of the consumed power to rated power of the target device being less than the reference value.

* * * * *